(12) United States Patent
Gessford et al.

(10) Patent No.: US 6,659,812 B2
(45) Date of Patent: Dec. 9, 2003

(54) SURFACE MOUNT PROBE POINT SOCKET AND SYSTEM

(75) Inventors: Marc A. Gessford, Portland, OR (US); William A. Hagerup, Portland, OR (US); Mark W. Nightingale, Washougal, WA (US)

(73) Assignee: Tektronix, Inc., Beaverton, OR (US)

( * ) Notice: Subject to any disclaimer, the term of this patent is extended or adjusted under 35 U.S.C. 154(b) by 61 days.

(21) Appl. No.: 10/126,558

(22) Filed: Apr. 19, 2002

(65) Prior Publication Data

US 2003/0199208 A1 Oct. 23, 2003

(51) Int. Cl.[7] .............................................. H01R 11/22
(52) U.S. Cl. ......................................... 439/851; 439/83
(58) Field of Search ................................ 434/851, 482; 324/149, 754, 755, 756, 757, 758; 439/83, 876, 78, 81, 82

(56) References Cited

U.S. PATENT DOCUMENTS

| | | | |
|---|---|---|---|
| 5,169,322 A | 12/1992 | Frantz et al. ................. | 439/82 |
| 5,362,244 A | 11/1994 | Hanson et al. ................ | 439/82 |
| 5,607,313 A | 3/1997 | Nyman .......................... | 439/83 |
| 6,142,836 A | 11/2000 | Deckmann et al. .......... | 439/801 |

Primary Examiner—Ross Gushi
(74) Attorney, Agent, or Firm—William K. Bucher

(57) ABSTRACT

A surface mount probe point socket has a housing with base and a socket extending from the base. The base has a length and width sufficient for attaching the housing to a circuit trace using an electrically conductive material while adding minimal inductance and capacitance to the circuit trace. The socket has a height and diameter for supporting a measurement probe in the housing while adding minimal inductance and capacitance to the measurement probe. A probe point contact is disposed in the bore of the socket for receiving a probe point disposed in the end of the measurement probe to secure the probe in the housing. Two surface mount probe point sockets may be joined together with an alignment gage and attached to adjacent circuit traces to produce a surface mount probe point socket system for differential measurement probes.

16 Claims, 4 Drawing Sheets

SURFACE MOUNT PROBE POINT SOCKET AND SYSTEM

BACKGROUND OF THE INVENTION

The present invention relates to probing of electrical circuitry on a substrate, such as a circuit board, and more particularly surface mount probe point socket and system that replaces current square pin probe point contacts.

The electronics industry populates circuit boards and the like with square pins to provide probing points for measurement probes. The measurement probe has either a socket type probe point that fits over the square pin or a needle type probe point that is placed on the square pin. The circuit board is laid out with circuit traces that electrically connect the various electrical elements on the board. Through holes are formed in the board that intersect the traces in the board and accept the square pins. The square pins are soldered to the traces to electrically couple the square pins to the traces and provide circuit continuity. The use of square pin contacts has proven to be an efficient and cost effective way of probing electronic circuitry on a circuit board.

With the increasing speed of electronic components, the use of square pin contacts are proving to be a problem. At higher frequencies, the square pin contacts add capacitance and inductance at the probe tip of the measurement probe which affects the quality of the measured signal. In addition, the square pin contacts act as radiating antennas when high speed edge signals are applied to the contacts.

What is needed is a replacement for the square pin contact that is compatible with the high frequency circuits of electronic equipment. The replacement needs to be physically as small as possible so as not to add inductance and capacitance to the circuit trace or to the measurement probe tip. The replacement further needs to be structurally strong enough to support the measurement probe for hands free probing of the device under test. The replacement also needs to be flexible enough to support various types of probing applications, such as differential probing of the device under test.

SUMMARY OF THE INVENTION

Accordingly, the present invention is to a surface mount probe point socket attachable to circuit traces or contact pads of a substrate for receiving a probe point of a high frequency measurement probe. The probe point socket has an electrically conductive housing having a base and socket with the socket extending from the base and having a bore enclosed by an exterior wall. The base has a length and width sufficient for attaching the housing to the circuit trace or contact pad while adding minimal inductance and capacitance to the circuit trace or pad. The socket has a height and diameter for supporting the measurement probe in the housing while adding minimal inductance and capacitance to the measurement probe. A probe point contact is disposed in the bore of the socket for receiving the probe point of the measurement probe to secure the probe in the housing.

In one configuration of the housing, the socket has vertically disposed slots formed in the exterior wall while in a second configuration the socket has a horizontal machined groove formed in the exterior wall of the socket near the base. In a further configuration, the rectangular base is notched on the underside below the socket and grooves formed on the top side of the base adjacent to the socket. The apex of the groove provides a stress concentration line in the socket or base that allows the socket to break away from the base if probe secured in the socket is accidentally hit. The probe point contact has a first configuration having inwardly disposed fingers extending from a frame. In a alternative configuration, the probe point contact is formed an electrically conductive elastomer having sufficient tensile strength, compression set, hardness, deflection force, elongation and percent recovery for repeatably securing the measurement probe in the housing.

Multiple surface mount probe point sockets may be used in a surface mount probe point socket system for receiving probe points of a high frequency differential measurement probe. A non-conductive alignment gage is provides having first and second apertures formed therein. Each aperture receives one of the socket of first and second housing for positioning the housing on the adjacent circuit traces. The bases of the housing are attached to the adjacent circuit traces or contact pads and the probe points of the differential measurement probe are secured in the probe point contacts in the sockets of the housing.

The objects, advantages and novel features of the present invention are apparent from the following detailed description when read in conjunction with appended claims and attached drawings.

DETAILED DESCRIPTION OF THE PREFERRED EMBODIMENT

Figure 1:
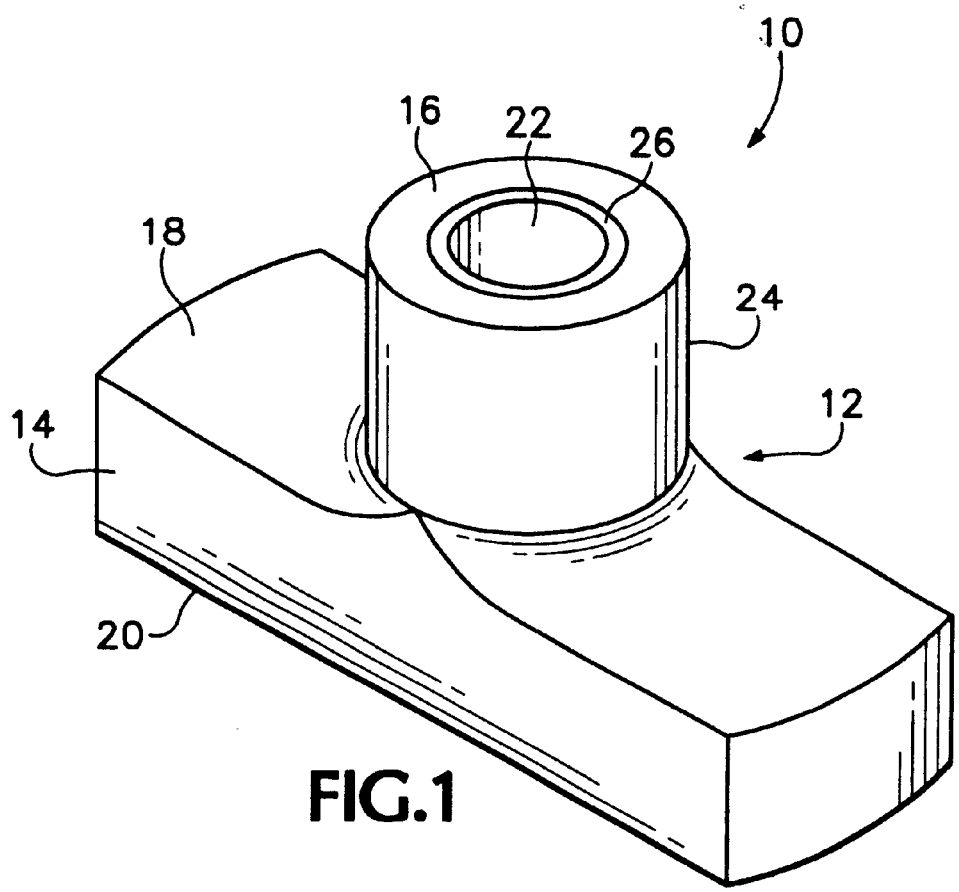
FIG. 1 is a perspective view illustrating the surface mount probe point socket according to the present invention.
Figure 2:
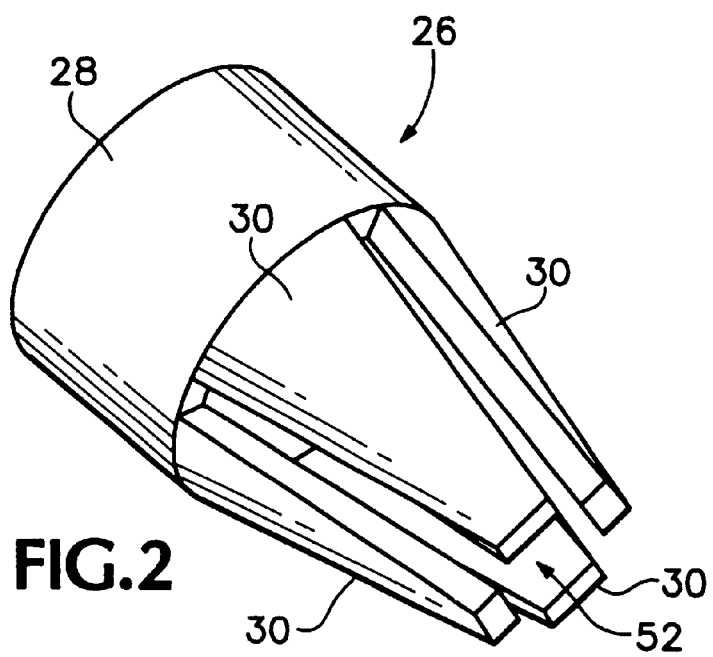
FIG. 2 is a perspective view of the probe point contacts in the surface mount probe point socket according to the present invention.

Referring to FIG. 1, there is a perspective view of the surface mount probe point socket 10 of the present invention. The probe point socket 10 has an electrically conductive housing 12 having a substantially rectangular base 14 and vertically extending socket 16. The base has top and bottom surfaces 18, 20 with the socket 16 extending in a substantially vertical direction from the top surface 18 of the base 14. The socket 16 has a bore 22 formed therein enclosed by an exterior wall 24. In the preferred embodiment of the invention, the bore 22 extends through the base 14 and intersects the bottom surface 20 of the base 14. A probe point contact 26, as illustrated in FIG. 2, is disposed in the bore 22. The probe point contact 26, such as manufactured by Milmax Manufacturing Corp., Oyster Bay, N.Y., under part numbers #9 or #22, has a circular support member 28 with inwardly angled fingers 30 that engage a probing point of a measurement probe.

Figure 3:
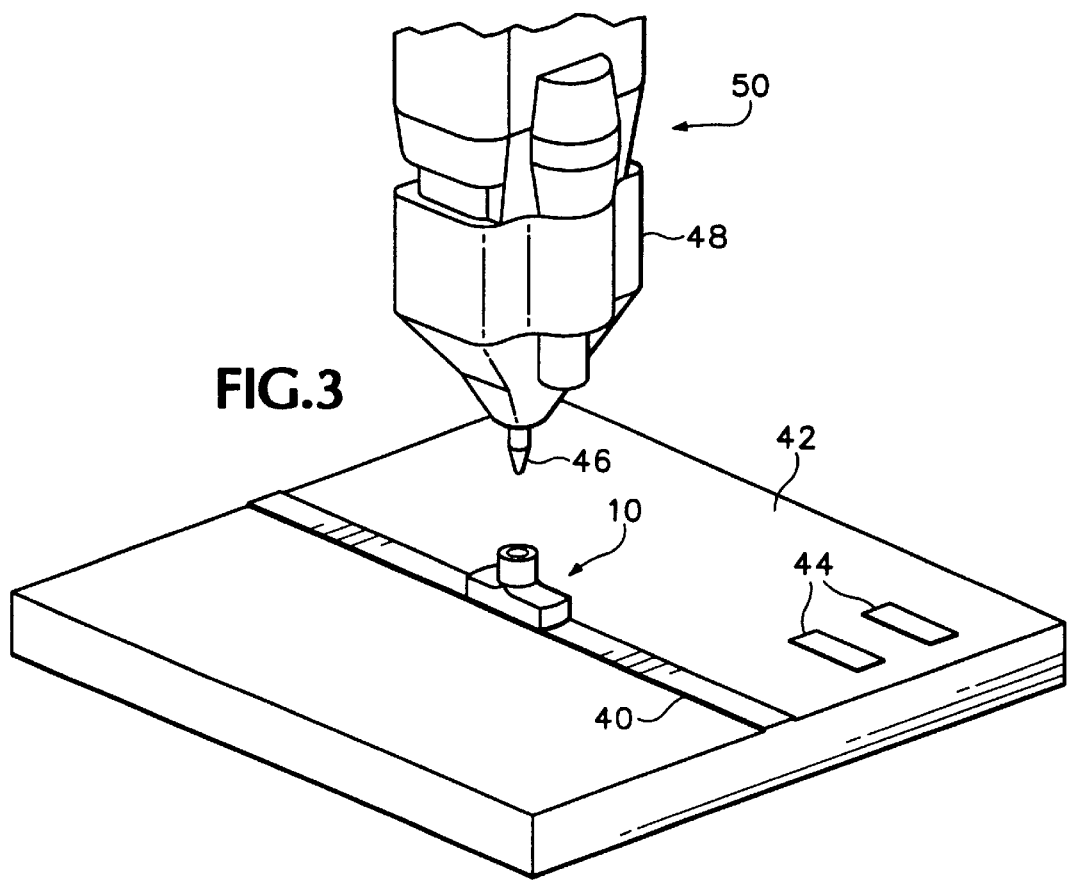
FIG. 3 is a perspective view of the surface mount probe point socket according to the present invention secured to a circuit trace formed on the surface of a circuit board.

Referring to FIG. 3, there is illustrated a perspective view of the surface mount probe point socket 10 secured to a circuit trace 40 formed on the surface of a circuit board 42. The surface mount probe point socket 10 may also be secured to a contact pad 44 formed on the surface of the circuit board 42 that is electrically coupled to the circuit trace or to a circuit trace buried within the circuit board 42.

For a buried circuit trace, an electrically conductive via connects the buried circuit trace to the surface contact pad 44. Generally, the contact pad 44 will have a footprint that is the same as the base 14 of the surface mount probe point socket 10. The long dimension of the rectangular shaped base 14 of the probe point socket 10 is aligned parallel with the circuit trace 40 or the long dimension of the contact pad 44 with the bottom surface 20 of the base 14 in contact with the circuit trace 40 or pad 44. The probe point socket 10 is preferably soldered to the circuit trace 40 or pad 44 using well known surface mounting techniques. The probe point sockets 10 may also be individually soldered to circuit traces 40 or pads 44 or, alternately, glued to the traces or pads using an electrically conductive adhesive. A probing tip 46 extends from the end of a measurement probe head 48 of a measurement probe 50 and is inserted into the bore 22 of the socket 16 with the contact fingers 30 of the probe point contact 26 engaging the probing tip 46.

The housing 12 is made of an electrically conductive material, such as brass, beryllium-copper or the like, that is preferably plated with a layer of gold over a layer of nickel. The dimensions of the housing 12 are optimized to minimize inductance and capacitance at the measurement probe tip 46. The base 14 has an overall length of approximately 0.150 inches, a width of 0.050 inches and a height of approximately 0.030 inches. The socket 16 has a height of approximately 0.050 inches with the exterior wall 24 having an outside diameter of approximately 0.050 inches and an inside diameter of 0.030 inches. The circular support member 28 of the probe point contact 26 has an overall length of approximately 0.051 inches, an outside diameter of approximately 0.031 inches and an inside diameter of approximately 0.020 inches. The distal ends of the inwardly angled fingers 30 form an opening 52 having a diameter of approximately 0.015 inches. The dimensions given above provide a surface mountable probe point socket 10 that has a sufficient length and width in the base 14 to secure the probe point socket 10 to a circuit trace 40 or contact pad 44 and a socket 16 height and exterior wall 24 thickness to support the measurement probe 50 in the housing 12 for hands free probing of a device under test. This is achieved, in part, by providing the probe point contact 26 within the socket 16 of the housing 12. The contact fingers 30 of the probe point contact 26 apply lateral gripping pressure on the probing tip 46 of the measurement probe 50 to secure the measurement probe in the housing 12 of probe point socket 10.

Adding conductive material at the probing tip 46 of a measurement probe 50 will add inductance and capacitance to the probing tip. The dimensions of the surface mount probe point socket 10 adds minimal inductance and capacitance to the probing tip 46 while supporting the measurement probe 50. The distance the probing tip 46 is away from the point of contact, i.e. the circuit trace 40 or pad 44, increases the inductance at the probe tip 46. In the preferred embodiment, the overall height of the probe point socket 10 is made smaller than the length of the probing tip 46 of the measurement probe 50 to allow the probing tip 46 to engage the circuit trace 40 or contact pad 44 of the circuit board 42. The length of the probing tip 46 may be smaller than the overall height of the housing 12 but the probing tip 46 needs to be of a sufficient length to be gripped by the inwardly angled contact fingers 30 of the probe point contact 26. The signal path to the probing tip 46, in this instance is through the contact fingers 30 and the housing 12. This increases the inductance at the probing tip 46 but it is substantially less than the inductance at the probing tip associated with square pin contacts.

Capacitance is primarily driven by the thickness of the conductors in the signal path. Since the probe point socket 10 becomes part of the electrical input, some capacitance is added. For high speed signal transmission, the circuit traces 40 are formed as microstrip transmission lines with a conductive ground layer formed below the circuit traces 40 in the circuit board 42. The extra capacitance of the probe point socket 10 is minimized by soldering the long dimension or axis of the base 14 in the same direction as the transmission direction of the microstrip transmission line. The microstrip transmission line itself has capacitance along its length, even without the probe point socket 10. The width of the probe point socket 10 is made as narrow as possible to conform to the width of the circuit trace 40 while maintaining sufficient structural strength to support the measurement probe 50 in the socket 10. Increasing the width of the circuit trace 40 increases the capacitance of the microstrip transmission line which in turn decreases the capacitive effect of the probe point socket 10. In some instances, the width of the circuit trace 40 may be sufficient to swamp capacitive effects of the probe point socket 10.

Figure 4:
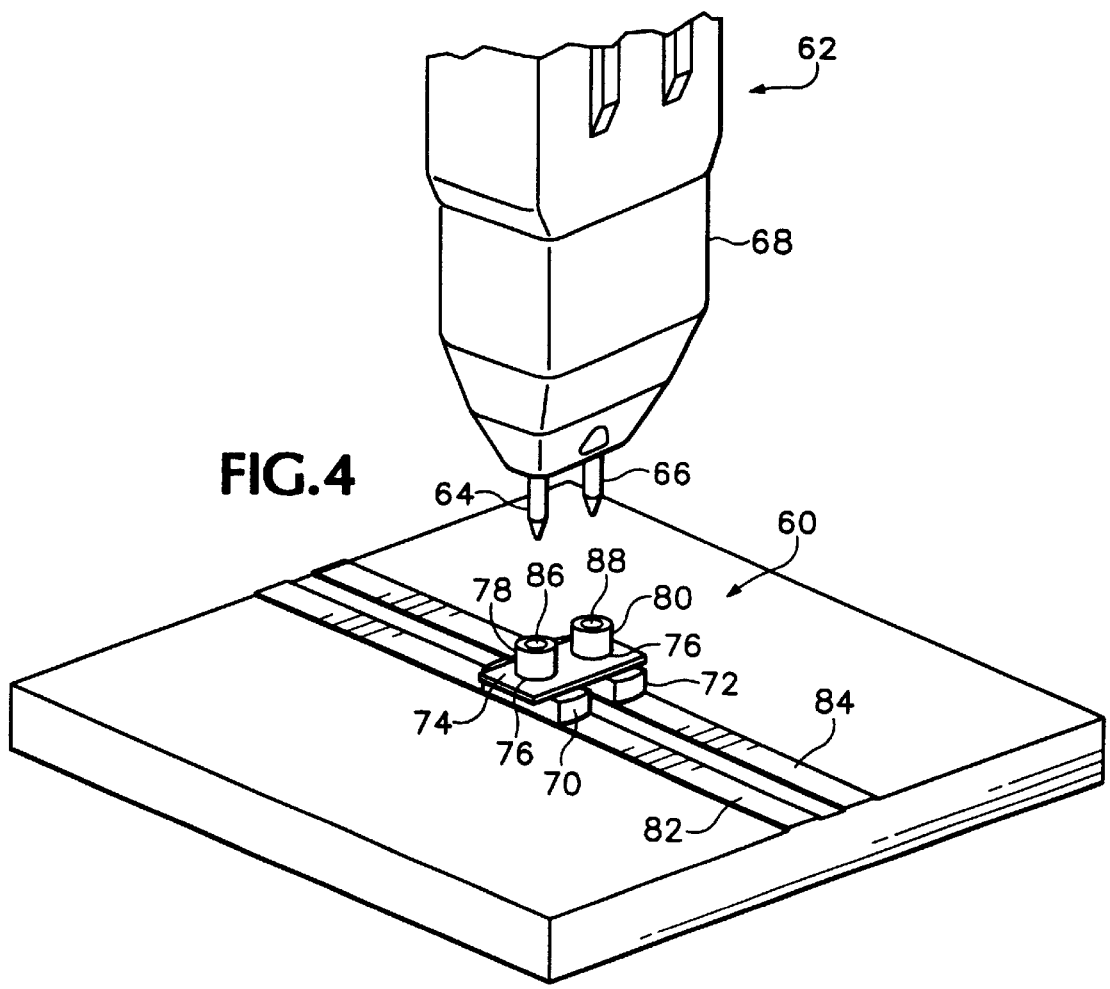
FIG. 4 is a perspective view of a surface mount probe point socket system according to the present invention for use with a differential measurement probe.

Referring to FIG. 4, there is illustrated a surface mount probe point socket system 60 for use with a differential measurement probe 62. The differential measurement probe 62 has dual probing tips 64, 66 extending from a measurement probe head 68. One such differential probe is the P7330, manufactured and sold by Tektronix, Inc., Beaverton, Oreg., which has 0.100 inch center to center spacing between probing tips. Two surface mount probe point sockets 70, 72 are positioned in a non-conductive alignment gage 74, such as a Polyether Imide manufactured and sold by GE Plastics, Pittsfield, Mass., under the brand name of Ultem® plastic. The alignment gage 74 has apertures 76 formed therein that receive the sockets 78, 80 of the surface mount probe point sockets 70, 72. For differential probes having a 100 mil center-to-center spacing between the probing tips, the center-to-center spacing of the apertures 76 is 100 mils. Different center-to-center spacings may be used for differential probing tips with different spacing. The probe point sockets 70, 72 are aligned parallel to each other on adjacent circuit traces 82, 84 or contact pads. The differential probe tips 64, 66 are inserted into the bores 86, 88 of the respective probe point sockets 70, 72. The side surface area of the probe point sockets 70, 72 affect the probe tip capacitance of the differential probe tips 64,66. The greater the surface area of the probe point sockets 70, 72, the greater the capacitance between the probing tips 64, 66. The length and height of the base 14 as well as the diameter and height of the socket 16 are made as small as possible to minimize the capacitive effects between the probe point sockets 70, 72 while at the same time providing an adequate bonding surface for the probe point socket 70, 72 and support for the differential measurement probe 62.

Figure 5A:
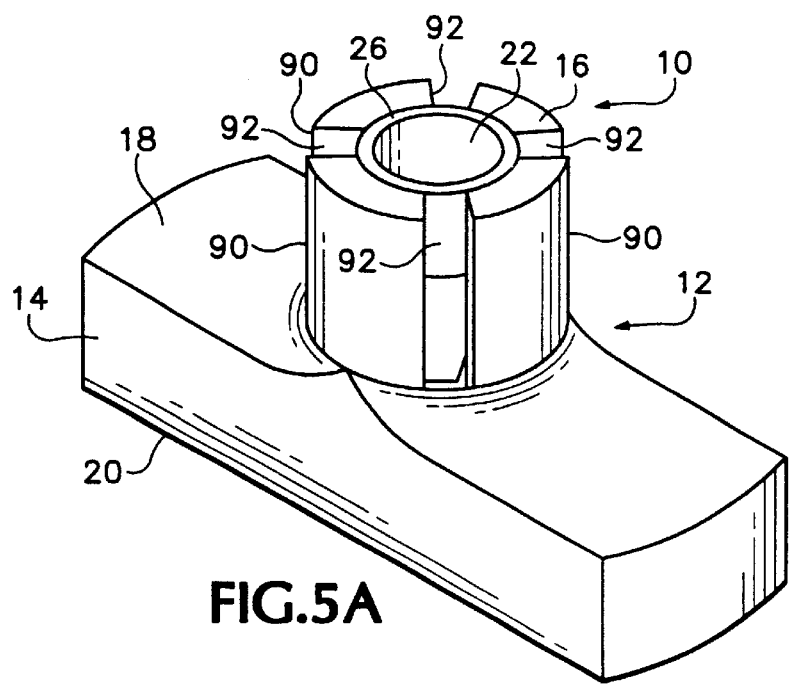
FIGS. 5A–5C are perspective views of alternative configurations of the surface mount probe point socket according to the present invention.
Figure 5B:
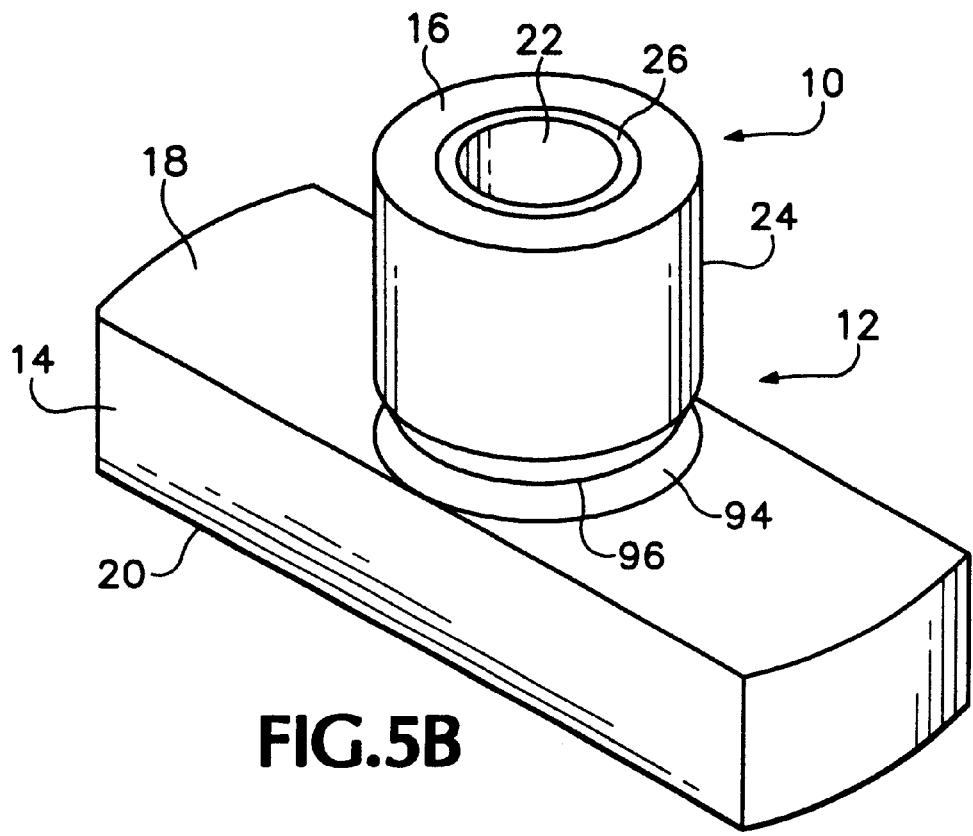
Figure 5C:
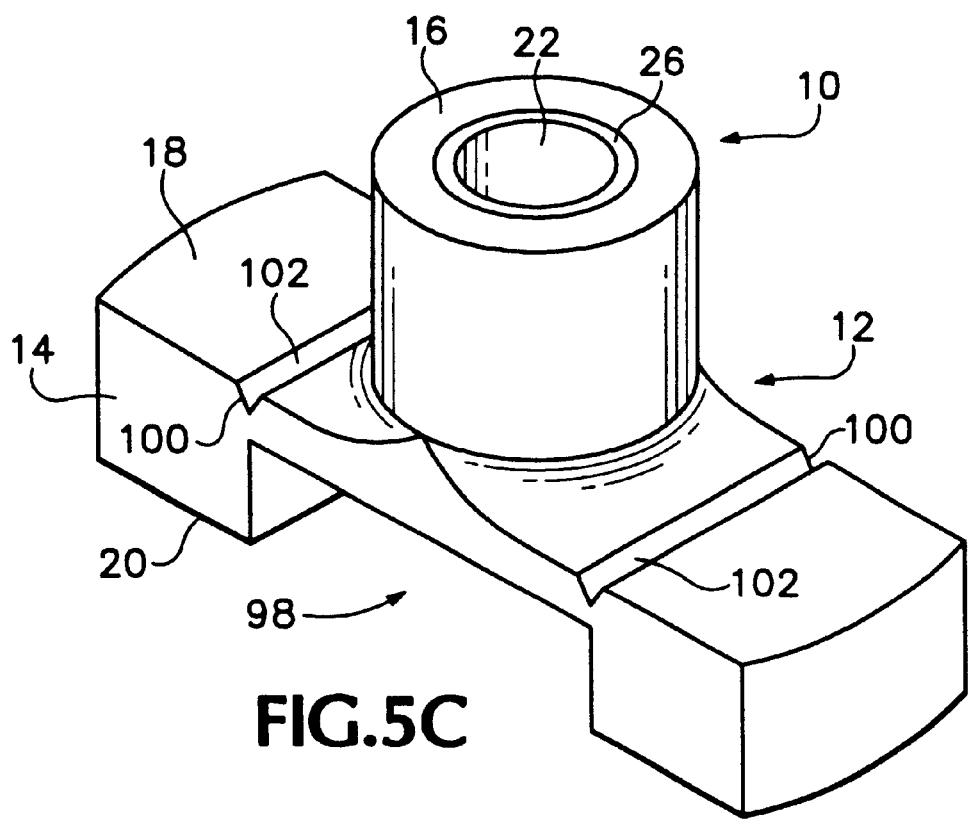

Because the measurement probe head 50 or 62 is extending vertically from the circuit board 42 and is supported by the probing tip or tips 46, 64, 66 in the surface mounted probe point socket or sockets 10, there is a possibility of damage to the measurement probe head 50 or 62 if it accidentally hit with the probing tip or tips 46, 64, 66 in the probe point socket or socket 10. A solution to this potential problem, is to allow the socket 16 to break away from the base 14 when lateral forces are applied to the measurement probe head 50 or 62. FIGS. 5A through 5C illustrate three alternative configurations of the surface mount probe point socket 10 that allows the probe point socket 16 to mechanically give before damage occurs to the measurement probe head 50 or 62. In FIG. 5A, the socket 16 is formed with a segmented exterior wall 90 using vertical slots 92. Lateral force on the measurement probe head 50 or 62 causes one or more of the segments 90 of the exterior wall to bend outward releasing the probing tip or tips 46, 64, 66 from the socket 16. In FIG. 5B, a horizontal groove 94 is formed in the exterior wall 24 of the socket 16 near the base 14. The apex 96 of the groove 94 provides a stress concentration line in the socket 16 that allows the socket 16 to break away from the base 14 when a lateral force is applied to the measurement probe head 50 or 62. In FIG. 5C, a notch 98 formed in the base 14 from the bottom surface 20 extending below the socket 16. Grooves 100 are formed in the top surface 18 adjacent to the socket 16 with the apex 102 of the grooves 100 providing a stress concentration line in the base 14 that allows the socket 16 to break away from the base 14. The embodiment of FIG. 5C is also advantageous for surface mount probe point socket system 60 where the surface areas of the probe point sockets 10 are important.

The probe point contact 26 has been described as inwardly angled contact fingers 30 extending from a support member 28. Alternately, an electrically conductive elastomer may also be used. The electrically conductive elastomer is disposed in the bore 22 of the socket 16 and secures the probing tip or tips 46, 64, 66 in the housing 12. The electrically conductive elastomer has specific properties, such as tensile strength, compression set, hardness, deflection force, elongation, percent recovery and the like that allow the probing tip or tips 46, 64, 66 to be repeatably secured in the socket 16. Preferably the elastomer has a tensile strength in the range of 300 PSI or 2.07 Mpa., a maximum compression set of 25%, a Shore A hardness in the range of 45, a 25% deflection force in the range of 4 lb/in or 0.71 kg/cm and a 50% deflection force in the range of 12 lb/in or 2.14 kg/cm, and elongation in the range of 250%. The compression set is expressed as a percentage of deflection at 25% deflection. Percent recovery is determined from the compression set as one-fourth of the compression set value subtracted from 100%. For a compression set of 25% the recovery percent is 93.75%. A silver-copper conductive filler is preferably used in the elastomer having a volume resistivity in the range of 0.008 ohm/cm. An example of an electrically conductive elastomer that meets the above described properties is Cho-Form 2.1, manufactured and sold by Chomerics, a Division of Parker Hannifin, Woburn, Mass. Other types of electrically conductive elastomers having similar properties may be used without departing from the scope of the present invention.

A surface mount probe point socket has been described that attaches to a circuit traces or contact pads of a substrate for receiving a probing point of a high frequency measurement probe. The probe point socket supports the measurement probe for hands free probing while adding minimal inductance and capacitance to the measurement probe. The probe point socket has an electrically conductive housing having a base and socket with the socket extending from the base and having a bore enclosed by an exterior wall. A probe point contact is disposed in the bore of the socket for receiving the probe point of the measurement probe to secure the probe in the housing.

It will be obvious to those having skill in the art that many changes may be made to the details of the above-described embodiments of this invention without departing from the underlying principles thereof. The scope of the present invention should, therefore, be determined only by the following claims.

What is claimed is:

1. A surface mount probe point socket attachable on a circuit trace of a substrate for receiving a probe point of a high frequency measurement probe comprising:

an electrically conductive housing having a base and socket with the socket extending from the base and having a bore enclosed by an exterior wall and a horizontal stress concentration line formed in the exterior wall of the socket proximate the base that allows the socket to break away from the base and a height and diameter that supports the measurement probe in the housing while adding minimal capacitance to the measurement probe, and the base having a length and width sufficient for attaching the housing to the circuit trace while adding minimal inductance to the circuit trace and the socket; and a probe point contact disposed in the bore of the socket receiving the probe point to secure the measurement probe in the housing.

2. The surface mount probe point socket as recited in claim 1 wherein the horizontal stress concentration line further comprises a horizontal machined groove formed in the exterior wall of the socket proximate the base with the apex of the groove providing the horizontal stress concentration line in the socket.

3. The surface mount probe point socket as recited in claim 1 wherein the probe point contact comprises inwardly disposed fingers extending from a frame.

4. The surface mount probe point socket as recited in claim 1 wherein the probe point contact comprises an electrically conductive elastomer disposed in the bore of the socket having sufficient tensile strength, compression set, hardness, deflection force, elongation and percent recovery for repeatably securing the measurement probe in the housing.

5. A surface mount probe point socket attachable on a circuit trace of a substrate for receiving a probe point of a high frequency measurement probe comprising:

an electrically conductive housing having a base and socket with the socket extending from the base and having a bore enclosed by an exterior wall and having a height and diameter that supports the measurement probe in the housing while adding minimal capacitance to the measurement probe, and the base having top and bottom surfaces with a notch formed in the base from the bottom surface and extending below the socket with stress concentration lines formed in the top surface of the base on either side of and adjacent to the socket that allows the socket to break away from the base and a length and width sufficient for attaching the housing to the circuit trace while adding minimal inductance to the circuit trace and the socket; and a probe point contact disposed in the bore of the socket receiving the probe point to secure the measurement probe in the housing.

6. The surface mount probe point socket as recited in claim 5 wherein the stress concentration lines further comprise grooves formed in the top surface adjacent to and on either side of the socket with the apex of the grooves providing the stress concentration lines.

7. The surface mount probe point socket as recited in claim 5 wherein the probe point contact comprises inwardly disposed fingers extending from a frame.

8. The surface mount probe point socket as recited in claim 5 wherein the probe point contact comprises an electrically conductive elastomer disposed in the bore of the socket having sufficient tensile strength, compression set, hardness, deflection force, elongation and percent recovery for repeatably securing the measurement probe in the housing.

9. A surface mount probe point socket system attachable on circuit traces of a substrate for receiving probe points of a high frequency differential measurement probe comprising:

first and second electrically conductive housings with each housing having a base and socket with the socket extending from the base and having a bore enclosed by an exterior wall and a horizontal stress concentration line formed in the exterior wall of the socket proximate the base that allows the socket to break away from the base and a height and diameter that supports the measurement probe in the housing while adding minimal capacitance to the measurement probe, and the base having a length and width sufficient for attaching the housing to the circuit trace while adding minimal inductance and capacitance to the circuit trace and the socket;

first and second probe point contacts with each respective contact being disposed in the bore of one of the sockets for receiving one of the probe points to secure the differential measurement probe in the housing; and a non-conductive alignment gage having first and second apertures formed therein with each aperture receiving one of the sockets of the housing for positioning the housing on the adjacent circuit traces.

10. The surface mount probe point socket system as recited in claim 9 wherein each horizontal stress concentration line further comprises a horizontal machined groove formed in the exterior wall of the socket proximate the base with the apex of the groove providing the horizontal stress concentration line in the socket.

11. The surface mount probe point socket system as recited in claim 9 wherein each probe point contact comprises inwardly disposed fingers extending from a frame.

12. The surface mount probe point socket system as recited in claim 9 wherein each probe point contact comprises an electrically conductive elastomer disposed in the bore of the socket having sufficient tensile strength, compression set, hardness, deflection force, elongation and percent recovery for repeatably securing the measurement probe in the housing.

13. A surface mount probe point socket system attachable on circuit traces of a substrate for receiving probe points of a high frequency differential measurement probe comprising:

first and second electrically conductive housings with each housing having a base and socket with the socket extending from the base and having a bore enclosed by an exterior wall and having a height and diameter that supports the measurement probe in the housing while adding minimal capacitance to the measurement probe, and the base having top and bottom surfaces with a notch formed in the base from the bottom surface and extending below the socket with stress concentration lines formed in the top surface of the base on either side of and adjacent to the socket that allows the socket to break away from the base and a length and width sufficient for attaching the housing to the circuit trace while adding minimal inductance and capacitance to the circuit trace and the socket;

first and second probe point contacts with each respective contact being disposed in the bore of one of the sockets for receiving one of the probe points to secure the differential measurement probe in the housing; and a non-conductive alignment gage having first and second apertures formed therein with each aperture receiving one of the sockets of the housing for positioning the housing on the adjacent circuit traces.

14. The surface mount probe point socket system as recited in claim 13 wherein the stress concentration lines further comprise grooves formed in the top surface adjacent to and on either side of the socket with the apex of the grooves providing the stress concentration lines.

15. The surface mount probe point socket system as recited in claim 13 wherein the probe point contact comprises inwardly disposed fingers extending from a frame.

16. The surface mount probe point socket system as recited in claim 13 wherein the probe point contact comprises an electrically conductive elastomer disposed in the bore of the socket having sufficient tensile strength, compression set, hardness, deflection force, elongation and percent recovery for repeatably securing the measurement probe in the housing.

* * * * *